US011710619B2

(12) United States Patent
Sato et al.

(10) Patent No.: US 11,710,619 B2
(45) Date of Patent: Jul. 25, 2023

(54) VACUUM PROCESSING APPARATUS

(71) Applicant: Hitachi High-Technologies Corporation, Tokyo (JP)

(72) Inventors: Kohei Sato, Tokyo (JP); Akitaka Makino, Tokyo (JP); Kazuumi Tanaka, Tokyo (JP); Yusaku Sakka, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 14/468,397

(22) Filed: Aug. 26, 2014

(65) Prior Publication Data

US 2015/0214014 A1 Jul. 30, 2015

(30) Foreign Application Priority Data

Jan. 27, 2014 (JP) ................................ 2014-012027

(51) Int. Cl.
*H01J 37/32* (2006.01)
*H01L 21/67* (2006.01)

(52) U.S. Cl.
CPC .. *H01J 37/32082* (2013.01); *H01J 37/32733* (2013.01); *H01J 37/32899* (2013.01); *H01L 21/6719* (2013.01); *H01L 21/67184* (2013.01)

(58) Field of Classification Search
USPC .................. 118/715–732; 156/345.1–345.55
See application file for complete search history.

(56) References Cited

U.S. PATENT DOCUMENTS

| 6,264,788 B1 * | 7/2001 | Tomoyasu | .......... C23C 16/4405 |
| | | | 118/500 |
| 6,565,662 B2 * | 5/2003 | Amano | ............ H01L 21/67126 |
| | | | 118/715 |
| 6,719,851 B1 * | 4/2004 | Kurita | ................. C23C 16/4407 |
| | | | 118/715 |

(Continued)

FOREIGN PATENT DOCUMENTS

| JP | 2005-101598 A | 4/2005 |
| JP | 2005-516379 A | 6/2005 |

(Continued)

OTHER PUBLICATIONS

Non-Final Office Action dated Jan. 19, 2017 for related U.S. Appl. No. 14/846,732.

(Continued)

*Primary Examiner* — Jeffrie R Lund
*Assistant Examiner* — Tiffany Z Nuckols
(74) *Attorney, Agent, or Firm* — Miles & Stockbridge, P.C.

(57) ABSTRACT

A vacuum processing apparatus that can excellently perform uniform processing and can efficiently perform regular maintenance and occasional maintenance even in the case where the diameter of a workpiece is increased. A vacuum processing apparatus having a vacuum transport chamber includes: a lower container in a cylindrical shape; a sample stage unit including a sample stage and a ring-shaped sample stage base having a support beam disposed in axial symmetry with respect to the center axis of the sample stage; an upper container in a cylindrical shape; and a moving unit that is fixed to the sample stage base and moves the sample stage unit in the vertical direction and in the horizontal direction.

8 Claims, 11 Drawing Sheets

(56) References Cited

U.S. PATENT DOCUMENTS

| | | | |
|---|---|---|---|
| 7,640,946 B2* | 1/2010 | Saito | C23C 16/44 |
| | | | 118/715 |
| 8,968,474 B2* | 3/2015 | Lim | H01J 37/32091 |
| | | | 118/715 |
| 2003/0003749 A1 | 1/2003 | Sexton et al. | |
| 2005/0193953 A1* | 9/2005 | Makino | H01J 37/32513 |
| | | | 118/733 |
| 2006/0099053 A1* | 5/2006 | Saito | C23C 16/44 |
| | | | 414/217 |
| 2008/0308134 A1 | 12/2008 | Maeda et al. | |
| 2010/0166955 A1 | 7/2010 | Becker et al. | |
| 2011/0110751 A1* | 5/2011 | Tauchi | H01L 21/67184 |
| | | | 414/217 |
| 2012/0091871 A1* | 4/2012 | Lim | H01L 21/6831 |
| | | | 312/319.1 |
| 2013/0068391 A1* | 3/2013 | Mazzocco | F16K 3/0218 |
| | | | 156/345.33 |
| 2013/0323860 A1* | 12/2013 | Antolik | H01J 37/32091 |
| | | | 438/14 |
| 2016/0217976 A1* | 7/2016 | Uemura | C23C 16/46 |
| 2016/0372305 A1* | 12/2016 | Uemura | H01J 37/3288 |
| 2018/0211893 A1* | 7/2018 | Ichino | H01L 21/67011 |
| 2019/0157053 A1* | 5/2019 | Isomura | H01J 37/32743 |
| 2019/0267219 A1* | 8/2019 | Uemura | H01J 37/3288 |
| 2022/0389575 A1* | 12/2022 | Uemura | C23C 16/505 |

FOREIGN PATENT DOCUMENTS

| | | |
|---|---|---|
| JP | 2005-252201 A | 9/2005 |
| JP | 2007-165659 A | 6/2007 |

OTHER PUBLICATIONS

Final Office Action dated Sep. 5, 2017 for related U.S. Appl. No. 14/846,732.
Non-Final Office Action dated Apr. 6, 2018 for U.S. Appl. No. 14/846,732.
Office Action dated Oct. 24, 2017 for related Japanese Application No. 2014-012027.
Final Office Action dated Nov. 2, 2018 for U.S. Appl. No. 14/846,732.
Non Final Office Action dated Jul. 10, 2019 in U.S. Appl. No. 14/846,732.
Final Office Action dated Apr. 16, 2020 in corresponding U.S. Appl. No. 14/846,732.
Non Final Office Action dated Sep. 21, 2020 in corresponding U.S. Appl. No. 14/846,732.

* cited by examiner

VACUUM PROCESSING APPARATUS

CLAIM OF PRIORITY

The present application claims priority from Japanese patent application JP 2014-12027 filed on Jan. 27, 2014 the content of which is hereby incorporated by reference into this application.

BACKGROUND OF THE INVENTION

1. Field of the Invention

The present invention relates to a vacuum processing apparatus including a processing chamber in which a pressure is reduced.

2. Description of the Related Art

In a vacuum processing apparatus that processes a workpiece such as a semiconductor wafer, a workpiece such as a semiconductor wafer is processed, which is held on a sample stage including an electrostatic chuck, in which a process gas is introduced into a vacuum processing chamber in which a pressure is reduced, for example, and plasma is generated from the introduced process gas by a chemical reaction with a radical or by sputtering electrons.

As for the vacuum processing apparatus, a vacuum processing apparatus is disclosed in Japanese Patent Application Laid-Open Publication No. 2005-252201, for example. Moreover, an electrostatic chuck used in a vacuum processing chamber is disclosed in Japanese Patent Application Laid-Open Publication (Translation of PCT Application) No. 2005-516379, for example.

SUMMARY OF THE INVENTION

In the vacuum processing apparatus, a process gas is used. When plasma is generated from a process gas to process a workpiece (a wafer), a reaction product is attached to the inside of the vacuum processing chamber. When a reaction product is attached to the surface of parts disposed in the processing chamber, a problem arises in that the reaction product becomes micro particles and the micro particles are peeled off and dropped from the surface due to the degradation of the parts, and the micro particles are attached to a wafer, as foreign substances for contamination. In order to suppress this problem, such processes (maintenance) are performed in which the parts in the processing chamber are replaced or cleaned on a regular basis to remove reaction products or the like, which are the causes of foreign substances, or to refresh the surfaces of the parts. During the maintenance, the inside of the processing chamber is exposed to the atmosphere at an atmospheric pressure, processing is not enabled, and the operation of the apparatus is stopped, so that the efficiency of processing is degraded.

Moreover, in these years, it is advancing that the diameter of the semiconductor wafer that is a workpiece is increased. Therefore, the vacuum processing apparatus is also increased in size, and individual parts configuring the apparatus are also increased in size as well as the weights of the parts tend to increase. It is predicted that it is not easy to dismount, move, and mount the parts and it takes time for maintenance, and there is a concern that maintenance efficiency is further degraded.

Therefore, the inventors investigated whether previously existing techniques can cope with the problems.

Japanese Patent Application Laid-Open Publication No. 2005-252201 discloses a vacuum processing apparatus including an outer chamber in which an upper inner chamber, a sample stage, and a lower inner chamber disposed on the exhaust unit side are provided, and the upper inner chamber and the sample stage configure a processing chamber that processes a workpiece. The following technique is described that in the vacuum processing apparatus, a discharge chamber base plate is disposed on the upper part of the upper inner chamber and configures a discharge chamber that generates plasma, the discharge chamber base plate is lifted upwardly for rotation as a hinge portion disposed on the transport chamber side is used as a fulcrum, the work space of the upper inner chamber is secured, and the upper inner chamber is lifted upwardly, and then taken out of the outer chamber. Moreover, a sample stage base plate is fixed with a ring-shaped support base member (a sample stage block) including support beams disposed and fixed about an axis as the center of the sample stage in the vertical direction is the axis. The sample stage base plate is lifted upwardly for rotation as the hinge portion disposed on the transport chamber side is used as a fulcrum, the work space of the lower inner chamber is secured, and the lower inner chamber is lifted upwardly, and then taken out of the outer chamber. It is noted that the support beams are disposed in axial symmetry as the center of the sample stage in the vertical direction is the axis (that is, the shape of the gas passage is in nearly coaxial symmetry with respect to the center axis of the sample stage), so that a gas or the like (particles or reaction products in a process gas or plasma) in the space on the sample stage in the upper inner chamber is passed through the space between the support beams, and exhausted through the lower inner chamber. Thus, a gas flow on the workpiece in the circumferential direction is made uniform, and uniform processing can be performed to the workpiece.

In the case where the technique that the discharge chamber base plate and the sample stage base plate are lifted as the hinge portion is used as a fulcrum is adapted to the maintenance of a workpiece whose diameter is increased, the support beams fixed with the discharge base plate or the sample stage are increased in size and in weight. Thus, there is a concern that it is difficult to manually lift them and it is difficult to secure work spaces for the upper inner chamber and the lower inner chamber. Moreover, the maintenance of the exhaust unit is performed so as to look into the exhaust unit from above the outer chamber. However, there is a concern that it is not enabled that hands do not reach the exhaust unit due to the upsized apparatus and it becomes difficult to sufficiently clean the exhaust unit. Furthermore, there is a concern that a scaffold becomes unstable in occasional maintenance such as the maintenance or replacement of parts configuring the discharge base plate or the sample stage that is lifted upwardly. Suppose that even though the support beams fixed with the discharge base plate or the sample stage are lifted using a crane or the like, the latter two problems are not solved.

Japanese Patent Application Laid-Open Publication (Translation of PCT Application) No. 2005-516379 discloses a cantilever substrate support unit that can be mounted on and dismounted from a vacuum processing chamber by inserting (horizontally) the cantilever substrate support unit into an opening provided on the side wall of the vacuum processing chamber and that includes an electrostatic chuck assembly mounted on the cantilever substrate support unit. There is a concern that in the case where this technique is applied to the maintenance of a workpiece whose diameter is increased, the substrate support unit is vacuum-sealed at the opening on the chamber side wall, and when the weight is increased, a load applied to the vacuum-sealed portion is increased, and it is difficult to keep a vacuum. Moreover, it is thought that the shape of the gas passage with respect to the center axis of the substrate support unit is not in coaxial symmetry because of the cantilever, a gas flow in the circumferential direction of the workpiece becomes ununiform, and it is difficult to perform uniform processing to the workpiece.

It is an object of the present invention to provide a vacuum processing apparatus that can excellently perform uniform processing and can efficiently perform regular maintenance as well as occasional maintenance even in the case where the diameter of a workpiece is increased.

An aspect to achieve the object is a vacuum processing apparatus including: at least one vacuum transport chamber; and at least one vacuum processing chamber coupled to the at least one vacuum transport chamber via a valve box disposed between the at least one vacuum transport chamber and the at least one vacuum processing chamber. The at least one vacuum processing chamber, the at least one vacuum transfer chamber, and the valve box are respectively arranged in an atmosphere, and the at least one vacuum processing chamber and the at least one vacuum transfer chamber are disposed outside the valve box. The valve box includes a transferring path for a workpiece to be processed through which the workpiece is transferred between the at least one vacuum transport chamber along a predetermined horizontal direction, and the at least one vacuum transport chamber and the valve box and the at least one processing chamber are arranged in this order in the predetermined horizontal direction. The at least one vacuum processing chamber includes: a base plate having an exhaust opening; a lower container disposed on the base plate, the lower container having an inner wall in a circular shape in a horizontal cross section; a sample stage unit including a sample stage on which the workpiece is located, and a ring-shaped sample stage base which is disposed around the sample stage on the lower container and is connected to the sample stage through a plurality of support beams supporting the sample stage, the plurality of support beams being disposed in axial symmetry with respect to a center axis of the sample stage, and the exhaust opening of the base plate being disposed directly below the sample stage; an upper container disposed on the ring-shaped sample stage base of the sample stage unit, the upper container having an inner side wall in a circular shape in a horizontal cross section and an outer side wall to which one end portion of the valve box is connected in an air-tight manner; vacuum seals air-tightly sealing an inside space of the at least one vacuum processing chamber from the atmosphere in the atmospheric pressure surrounding the at least one vacuum processing chamber and the valve box when the upper container is fixed to the base plate while (i) the outer side wall of the upper container is connected to one end the valve box in the air-tight manner and (ii) the lower container and the ring-shaped sample stage base are sandwiched between the upper container and the base plate, wherein portions of outer walls of the upper container and the valve box are exposed in the atmosphere and the vacuum seals are disposed between the base plate, the lower container, the ring-shaped sample stage base, and the upper container; and a rotating lifter which extends along a vertical direction and is disposed on an outside of the ring-shaped sample stage base, the rotating lifter being arranged in an outer peripheral region of the base plate and being located at a position horizontally farther than a center of the sample stage with respect to the valve box when the upper container is located above the ring-shaped sample stage base and is connected to one end of the valve box, and the rotating lifter is coupled to the ring-shaped sample stage base and a discharge block unit respectively in an upper portion of the lower end portion thereof. The rotating lifter has a pivot disposed above the lower end portion thereof, the ring-shaped sample stage base being coupled to the rotating lifter via the pivot, and the pivot extending in parallel to the vertical direction and being located at a position horizontally farther than a center of the sample stage with respect to the valve box, and wherein the rotating lifter is configured to perform a vertical operation to move the sample stage unit in a direction parallel to the vertical direction with respect to the lower container, and to perform a horizontal operation to move the sample stage unit in a horizontal direction around the pivot to a position distanced away from a region directly above the lower container with respect to the valve box.

According to the aspects of the present invention, it is possible to provide a vacuum processing apparatus that can excellently perform uniform processing and can efficiently perform regular maintenance as well as occasional maintenance even in the case where the diameter of a workpiece is increased.

DESCRIPTION OF THE PREFERRED EMBODIMENT

Figure 1A:
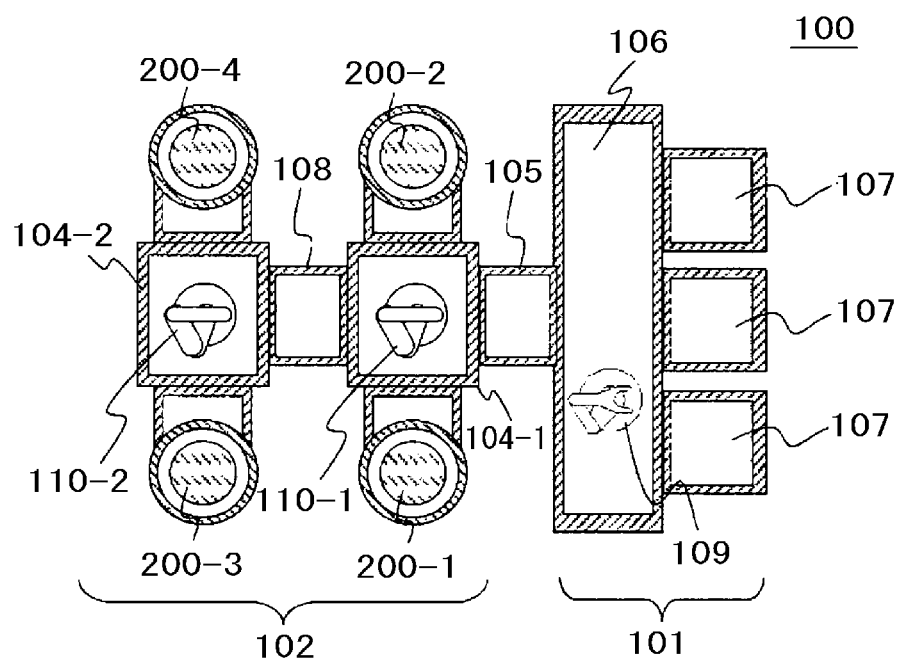
FIG. 1A is a schematic top view (a partial perspective view) of a vacuum processing apparatus according to an embodiment of the present invention.

The inventors investigated methods satisfying three items below in order to achieve the object.
(1) In order to secure excellent process uniformity, the shape of the processing chamber is formed in nearly coaxial symmetry with respect to the center axis of the sample stage.
(2) In order to allow easy regular maintenance, reaction products or the like can be quickly removed from chamber members that are parts targeted for regular maintenance even though the apparatus copes with large-diameter workpieces. It is noted that the term "easy regular maintenance" here includes the elimination of work in performing occasional maintenance such as the separation of power supply cables and water cooling purge.
(3) In order to allow easy occasional maintenance, a discharge electrode head and various sensors targeted for occasional maintenance can be easily extracted even though the apparatus copes with large-diameter workpieces.

As a result, it was revealed that it is effective to provide the following configuration.
A. The configuration for (1) is that the inner wall shape of the horizontal cross section of at least the vacuum processing chamber is formed in a circular shape, and the support beams that support the sample stage are disposed in axial symmetry as the center of the sample stage in the vertical direction is the axis, and the support beams are fixed to the ring-shaped support base member.
B. The configuration for (2) is that the parts for regular maintenance are swappable (replaceable) parts. In other words, the parts to which reaction products or the like are attached are not cleaned on the spot, and the parts are made replaceable with new parts or cleaned parts. Moreover, the parts targeted for occasional maintenance are collected in units for units of related parts, and are moveable in the horizontal direction in units, and the parts are easily avoided so as not to hamper work in performing regular maintenance.
C. The configuration for (3) is that units that collect the parts targeted for occasional maintenance for the related parts are moved in the horizontal direction in performing maintenance, and a work space is provided therearound.

In the following, the description will be given according to an embodiment. It is noted that in the drawings, the same reference numerals and signs show the same components.

Embodiment

Figure 1B:
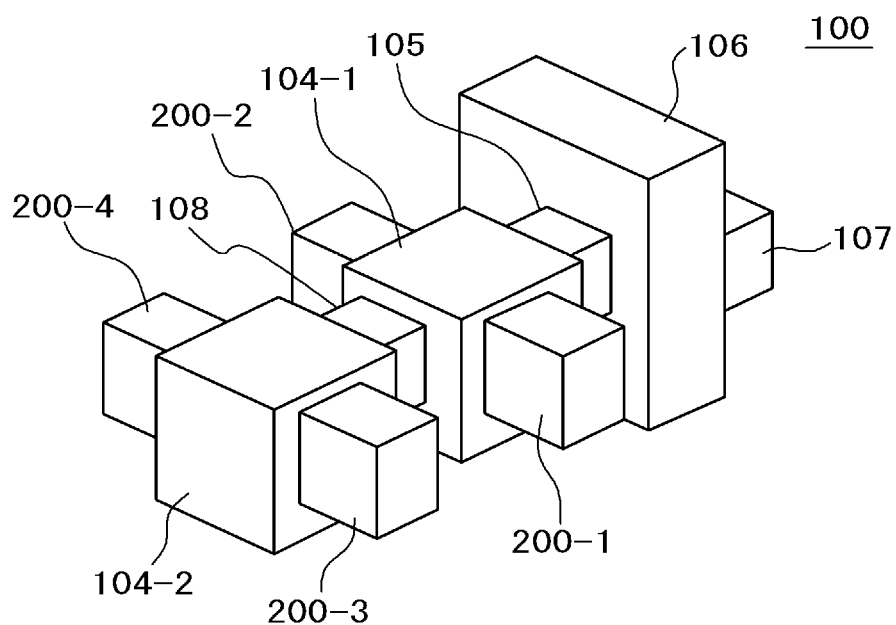
FIG. 1B is a schematic perspective view of the vacuum processing apparatus illustrated in FIG. 1A.

A vacuum processing apparatus according to an embodiment of the present invention will be described with reference to FIGS. 1A to 10B. FIG. 1A is a schematic top view (a partial perspective view) of a vacuum processing apparatus according to an embodiment, and FIG. 1B is a schematic perspective view of the vacuum processing apparatus illustrated in FIG. 1A. A plasma processing apparatus that is a vacuum processing apparatus 100 according to the embodiment includes an atmospheric block 101 and a vacuum block 102. The atmospheric block 101 is a portion in which a workpiece (a sample) such as a semiconductor wafer is transported, housed, and positioned under an atmospheric pressure, and the vacuum block 102 is a portion in which a sample such as a wafer is transported and processed, under a pressure reduced from an atmospheric pressure and a pressure is increased and decreased in the state in which the sample is placed.

The atmospheric block 101 includes an atmospheric transport chamber 106 and a plurality of cassette stages 107 mounted on the front face side of the atmospheric transport chamber 106 in which a cassette accommodating samples to be processed or cleaned is placed on the top face of the cassette stage 107. The atmospheric block 101 is a place in which wafers to be processed or cleaned that are accommodated in the cassettes on the cassette stage 107 are loaded into or unloaded out of the vacuum block 102 joined to the back face of the atmospheric transport chamber 106, and an atmospheric transfer robot 109 including a wafer holding arm for carrying wafers is disposed in the atmospheric transport chamber 106.

The vacuum block 102 includes a plurality of vacuum processing chambers 200-1, 200-2, 200-3, and 200-4 in which the pressure is reduced and samples are processed, vacuum transport chambers 104-1 and 104-2 joined to the vacuum processing chambers and including vacuum transfer robots 110-1 and 110-2 that carry samples in the inside under a reduced pressure, a lock chamber 105 that connects the vacuum transport chamber 104-1 to the atmospheric transport chamber 106, and an intermediate transport chamber 108 that connects the vacuum transport chamber 104-1 to the vacuum transport chamber 104-2. The vacuum block 102 is configured of units in which the pressure is reduced and a pressure at a high vacuum degree can be maintained. A controller controls the operations of the atmospheric transfer robot and the vacuum transfer robot and the processes in the vacuum processing chambers.

Figure 3A:
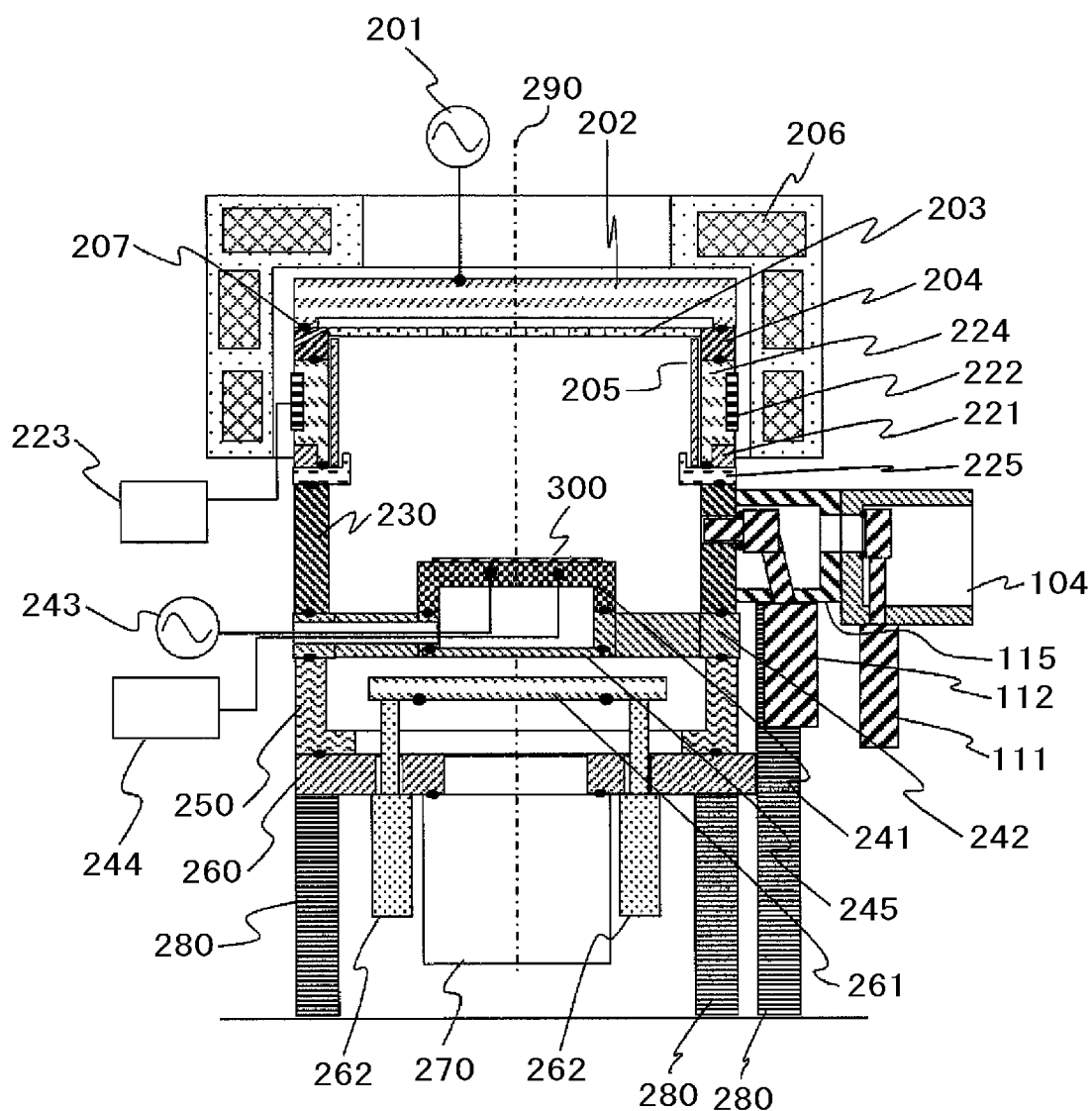
FIG. 3A is a cross sectional view of the vacuum processing chamber of the vacuum processing apparatus according to the embodiment of the present invention (the gate valve is closed)

FIG. 3A is a vertical cross sectional view of the outline of the configuration of the vacuum processing chamber according to the embodiment illustrated in FIG. 1A. More specifically, FIG. 3A is a schematic diagram of the configuration of the vacuum processing chamber of the vacuum processing chamber 200. In the embodiment, the vacuum processing chamber in the same structure is disposed. However, a vacuum processing chamber including another structure may be built in.

The vacuum processing chamber illustrated in FIG. 3A includes: a vacuum container including an upper container 230 and a lower container 250; a vacuum pump 270 joined to the vacuum container and disposed on the lower part; and a first radio frequency power supply 201 and a solenoid coil 206 disposed on the upper part. The upper container and the lower container have an inner wall in a circular shape in the horizontal cross section, and a cylindrical sample stage 241 is disposed in the center part of the inside of the containers. The outer walls of the upper container and the lower container configure vacuum walls. The sample stage 241 is held on support beams provided on a sample stage base 242, and the support beams are disposed in axial symmetry as the center of the sample stage in the vertical direction is the axis (that is, the shape of the gas passage is formed in nearly coaxial symmetry with respect to a center axis 290 of the sample stage). Since a gas or the like (particles or reaction products in a process gas or plasma) in the space on the sample stage 241 in the upper container 230 is passed through the space between the support beams and exhausted through the lower container 250, a gas flow is made uniform in the circumferential direction of the sample stage 241 on which a workpiece (a sample, a wafer) 300 is placed, and uniform processing can be performed to the workpiece 300. It is noted that the sample stage base 242 is in a ring shape including the support beams. The ring portion is held on the edge portions of the lower container and the upper container, which are the vacuum containers, and is vacuum-sealed, so that the sample stage base 242 can cope with an increase in the weight of the sample stage or the like.

In the embodiment, the vacuum processing chamber is configured of a plurality of members including the lower container 250 in a cylindrical shape, the ring-shaped sample stage base 242 including the support beams, the upper container 230 in a cylindrical shape, an earth ring 225, a discharge block 224 in a cylindrical shape, and a gas introducing ring 204 in turn stacked on a base plate 260. The members are vacuum-sealed by an O-ring 207. A cylindrical quartz inner cylinder 205 is disposed on the inner side of the discharge block 224. Moreover, a sample stage unit is configured in which the sample stage base 242 is fixed with the sample stage 241 including a sample stage bottom cover 245, and a discharge block unit is configured in which the discharge block 224 mounted with a heater 222 is fixed to a discharge block base 221. Furthermore, the upper container 230, the lower container 250, and the base plate 260 include a flange, and the upper container 230 and the lower container 250 are screwed to the base plate 260 through the flanges. It is noted that in the embodiment, the members configuring the vacuum processing chamber are in a cylindrical shape. However, the outer wall shape may be in a rectangle or in other shapes not limited to a circular shape in the horizontal cross section.

A cover member (a quartz plate) 202 in a disc shape configuring the vacuum container is disposed on the upper part of the vacuum processing chamber, and a shower plate 203 in a disc shape configuring the ceiling face of the vacuum processing chamber is disposed on the lower part. The cover member 202 and the shower plate 203 are dielectric members such as quartz, through which a radio frequency field such as microwaves, UHF waves, and VHF waves is transmitted. An electric field generated from the first radio frequency power supply disposed on the upper part is passed through the cover member 202 and the shower plate 203, and is supplied to the inside of the vacuum processing chamber. Moreover, the magnetic field generating unit (the solenoid coil) 206 is disposed around the outer side wall of the vacuum container, in which a magnetic field generated from the solenoid coil 206 can be supplied to the inside of the vacuum processing chamber.

The shower plate 203 is disposed with introduction holes for a process gas, which are a plurality of through holes, and a process gas introduced from the gas introducing ring 204 is supplied to the inside of the vacuum processing chamber through the introduction holes. A plurality of the introduction holes of the shower plate 203 is disposed in a region above the placement face of the sample, which is the top face of the sample stage 241, in axial symmetry about the center axis 290 of the sample stage 241. A process gas having a predetermined composition and made of different gas components is passed through the introduction holes equally disposed, and the gas is introduced into the vacuum processing chamber.

The process gas introduced into the vacuum processing chamber is excited by supplying an electromagnetic wave generated from the first radio frequency power supply 201 that is the electric field generating unit and a magnetic field generated from the solenoid coil 206 that is the magnetic field generating unit to the inside of the vacuum processing chamber, and plasma is generated in the space in the discharge block 224 above the sample stage 241. At this time, processing gas molecules are ionized into electrons and ions, or dissociated into radicals. The heater 222 connected to a first temperature controller 223 is mounted and the discharge block 224 disposed on discharge block base 221 is provided on the region in which plasma is generated, so that the quartz inner cylinder 205 contacting plasma can be heated. Thus, it is possible to reduce the attachment of reaction products to the quartz inner cylinder 205 and the discharge block 224. Therefore, these members can be removed from the targets for regular maintenance.

The sample stage 241 on which a wafer is placed is disposed in the vacuum processing chamber in such a manner that the sample stage 241 is match with the center axis 290 of the shower plate 203. In processing using plasma, a wafer, which is the workpiece 300, is placed on the circular placement face that is the top face of the sample stage 241, and processed in the state in which the wafer is sucked and held (electrostatically chucked) by film static electricity of a dielectric configuring the face. In the embodiment, in consideration of the use of a semiconductor wafer that is a sample in a diameter of 450 mm, the inner diameter of the vacuum processing chamber in a cylindrical shape was set to 800 mm. However, the inner diameter may be this dimension or less (about 600 mm).

Moreover, a radio frequency bias power supply (a second radio frequency power supply) 243 is connected to the electrode disposed in the sample stage 241, and the etching process advances by the mutual reaction between a chemical reaction taken place between the radicals and the wafer surface and a physical reaction in which charged particles in plasma are induced on and collided against the surface of the sample with a radio frequency bias formed on the upper part of the sample stage 241 and the sample 300 placed on the sample stage 241 by supplied radio frequency electric power. Furthermore, the temperature of the sample stage can be controlled at a desired temperature using the second temperature controller 244. The application of a radio frequency bias to the sample stage 241 and the temperature of the sample stage 241 are controlled through a power supply wiring code, a temperature control wiring code, or a coolant pipe disposed in the hollow space formed in the sample stage base 242 including the support beam. It is noted that although not illustrated in the drawing, a temperature sensor and an electrostatic chuck wiring code may be included in addition to the wiring codes. Since reaction products are easily attached to the upper container 230 disposed around the sample stage 241, the upper container 230 is a target member for regular maintenance.

The vacuum pump 270 is disposed on the lower part of the vacuum processing chamber, and the vacuum pump 270 is joined to the bottom part of the vacuum processing chamber through the base plate 260 including an exhaust opening. The exhaust opening provided on the base plate 260 is disposed directly below the sample stage 241, in which the exhaust conductance can be adjusted by vertically moving an exhaust unit cover 261 in a nearly disc shape disposed above the exhaust opening using a cylinder 262, and the amount and velocity of a gas, plasma, and products in the inside to be exhausted out of the vacuum processing chamber are adjusted using the vacuum pump 270. The exhaust unit cover 261 is opened in processing a workpiece, and the pressure of the space in the vacuum processing chamber is kept at a desired vacuum degree by the balance between the supply of a process gas and the operation of the exhaust unit such as the vacuum pump 270. In the embodiment, the pressure during processing is adjusted at a predetermined value in the range of 0.1 to 4 Pa. A molecular turbopump was used for the vacuum pump. It is noted that the exhaust unit cover 261 can be closed and can vacuum-seal the vacuum pump with the O-ring in performing maintenance. It is noted that a reference numeral 111 denotes a first gate valve, a reference numeral 112 denotes a second gate valve, a reference numeral 115 denotes a valve box, and a reference numeral 280 denotes a post.

Reaction products generated in processing a process gas introduced into the vacuum processing chamber and plasma are passed from the upper part of the vacuum processing chamber through the space on the outer circumferential side of the sample stage 241, and moved to the opening provided on the base plate 260 on the lower part through the lower container 250 by the operation of the exhaust unit such as the vacuum pump 270. Since reaction products are easily attached to the lower container 250, the lower container 250 is a target member for regular maintenance.

The pressure in the vacuum processing chamber during the etching process is monitored by a vacuum gage (not illustrated), and the pressure in the vacuum processing chamber is controlled by controlling the exhaust velocity using the exhaust unit cover 261. The supply of the process gas and the operations of the electric field generating unit, the magnetic field generating unit, the radio frequency bias, and the exhaust unit are adjusted by a controller, not illustrated, in connection to conduct communications.

For a process gas used in plasma processing, such a gas is used including one kind of gas or a gas that a plurality of kinds of gases is mixed at the optimum flow rate for the conditions of processes. The flow rate of the mixed gas is adjusted by a gas flow rate controller (not illustrated), and the mixed gas is introduced into a gas reservoir space between the shower plate 203 and the cover member 202 on the upper part of the vacuum processing chamber above the vacuum container through the gas introducing ring 204 joined to the gas flow rate controller. In the embodiment, a gas introducing ring made of stainless steel was used.

Figure 2A:
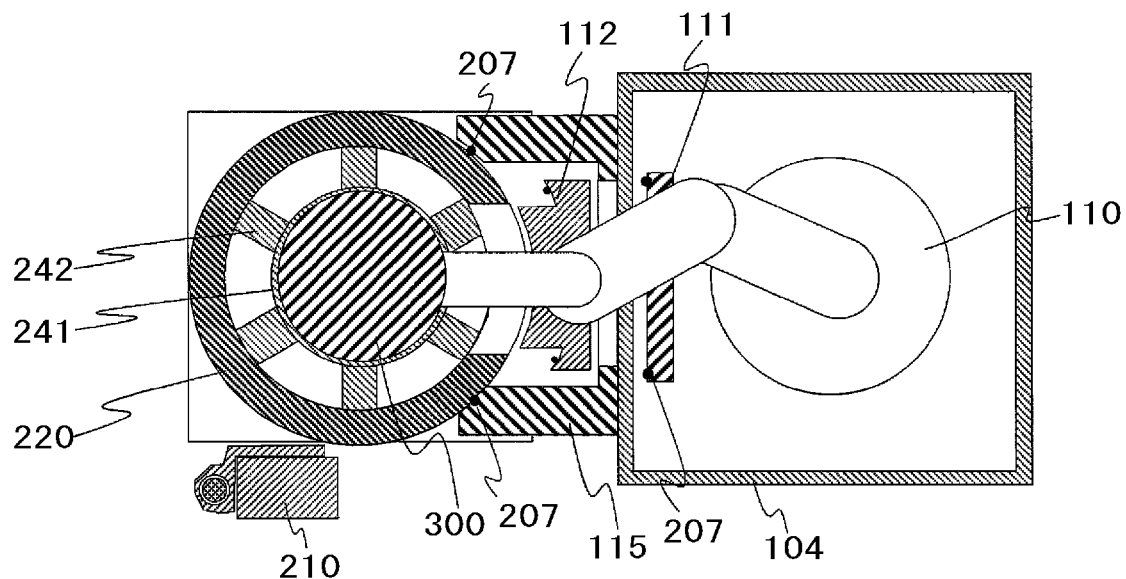
FIG. 2A is a schematic top view for explaining the essential part of the vacuum processing apparatus according to the embodiment of the present invention in which a workpiece is transported (a gate valve is opened and a transfer robot is loading a workpiece into a vacuum processing chamber or unloading a workpiece)
Figure 2B:
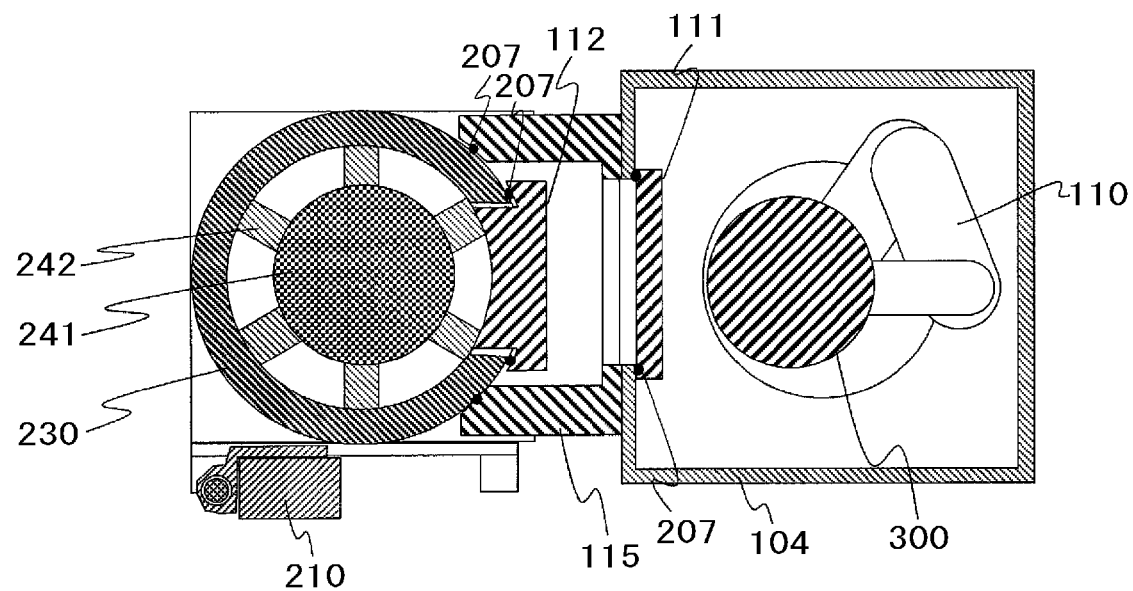
FIG. 2B is a schematic top view for explaining the essential part of the vacuum processing apparatus according to the embodiment of the present invention in which a workpiece is transported (the gate valve is closed and a workpiece is loaded into a vacuum transport chamber)

Next, the procedures of loading a workpiece into the vacuum processing chamber and unloading a workpiece out of the vacuum processing chamber will be described with reference to FIGS. 2A to 3B. First, in the atmospheric block, a wafer is unloaded out of the cassette by the atmospheric transfer robot, and loaded into the vacuum transport chamber 104 through the lock chamber. FIG. 2B is the state in which the wafer 300 is loaded into the vacuum transport chamber 104. The vacuum processing chamber is connected to the vacuum transport chamber through the first gate valve 111 and the second gate valve. In FIG. 2B, both of the gate valves are closed, and vacuum-sealed with the O-ring 207. The reference numeral 115 denotes the valve box, and a reference numeral 210 denotes a rotating lifter (a moving unit). The rotating lifter 210 will be described later. Subsequently, pressures are matched between the vacuum processing chamber and the vacuum transport chamber, and as illustrated in FIG. 2A, the wafer 300 is loaded from the vacuum transport chamber 104 to the vacuum processing chamber using the vacuum transfer robot 110 including the arm. At this time, both of the first gate valve 111 and the second gate valve 112 are opened. Subsequently, as illustrated in FIG. 3A, the wafer 300 is placed on the sample stage 241 in the vacuum processing chamber, the vacuum transfer robot is returned to the vacuum transport chamber, and the first gate valve 111 and the second gate valve 112 are closed.

Figure 3B:
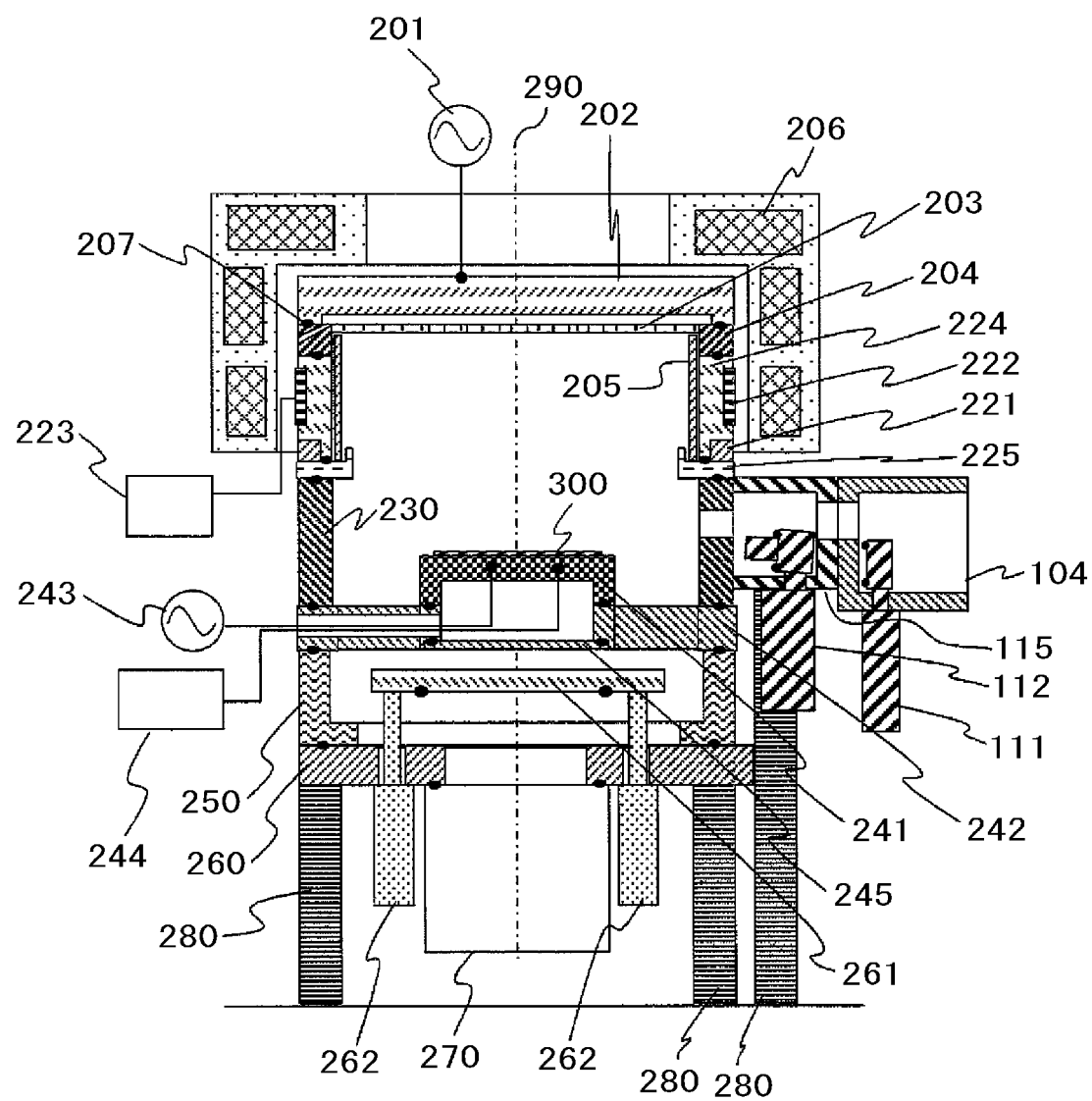
FIG. 3B is a cross sectional view of the vacuum processing chamber of the vacuum processing apparatus according to the embodiment of the present invention (the gate valve is opened)

After the processing to the wafer 300 is finished in the vacuum processing chamber, the pressures of the vacuum processing chamber and the vacuum transport chamber are adjusted, and then the first gate valve 111 and the second gate valve 112 are opened as illustrated in FIG. 3B. Subsequently, as illustrated in FIG. 2A, the wafer 300 is dismounted from the sample stage 241 using the vacuum transfer robot 110. Subsequently, as illustrated in FIG. 2B, the wafer 300 is loaded into the vacuum transport chamber 104. After that, the wafer 300 is processed in another vacuum processing chamber, or not processed, and transported to the cassette through the lock chamber.

Figure 4A:
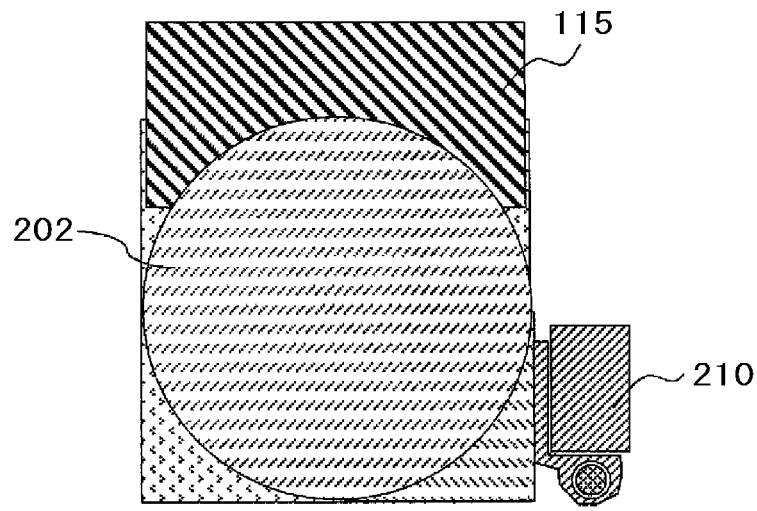
FIG. 4A is a top view for explaining the procedures of maintenance in the vacuum processing chamber of the vacuum processing apparatus according to the embodiment of the present invention (a coil and a power supply are dismounted)
Figure 4B:
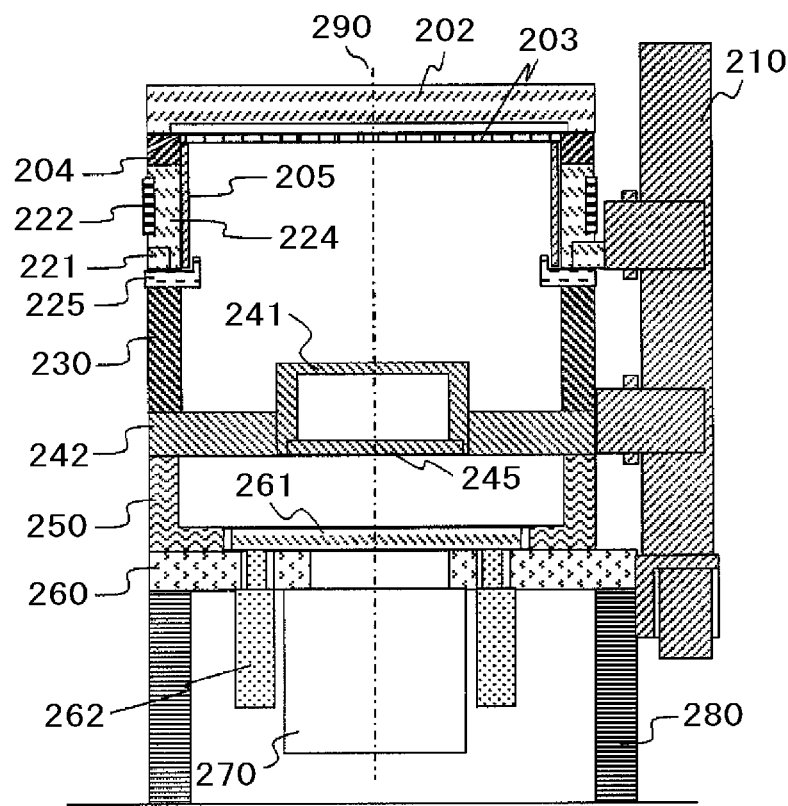
FIG. 4B is a schematic cross sectional view of the vacuum processing chamber illustrated in FIG. 4A.

Next, the procedures of regular maintenance will be described with reference to FIGS. 4A to 10B. FIGS. 4A and 4B are the configuration in which the solenoid coil 206 and the first radio frequency power supply 201 are removed from the configuration of the vacuum processing chamber illustrated in FIG. 3A or FIG. 3B and the opening of the base plate 260 connected to the vacuum pump 270 is blocked and vacuum-sealed with the exhaust unit cover 261. FIG. 4A is a plan view, and FIG. 4B is a cross sectional view. The vacuum pump 270 is vacuum-sealed with the exhaust unit cover 261 and the vacuum pump 270 is operated, so that the startup time of the vacuum processing chamber after maintenance can be shortened. It is noted that in the cross sectional view in FIG. 4B, the direction of the view is different from FIG. 3A or FIG. 3B for explaining the rotating lifter 210. In other words, the cross sectional view in FIG. 3A or FIG. 3B is a diagram seen from the right side of the plan view in FIG. 4A. However, the cross sectional view in FIG. 4B is a diagram seen from the lower side of the plan view in FIG. 4A. Cross sectional views in FIGS. 5B to 10B are diagrams seen from the same direction as the cross sectional view in FIG. 4B.

Figure 5A:
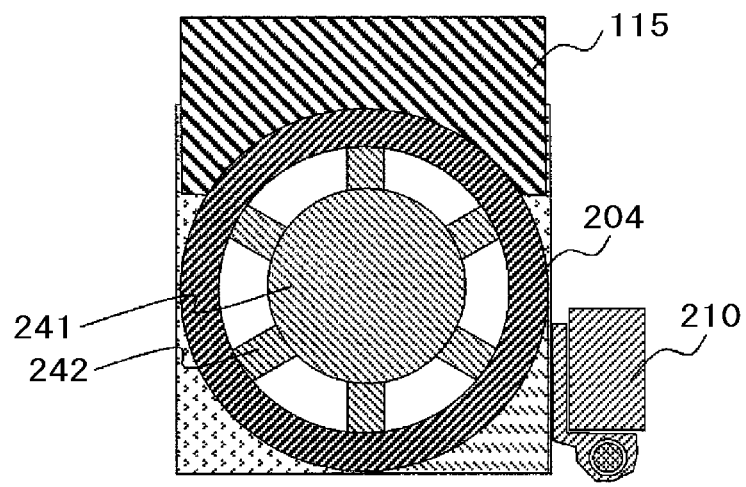
FIG. 5A is a top view for explaining the procedures of maintenance in the vacuum processing chamber of the vacuum processing apparatus according to the embodiment of the present invention (a quartz plate, a shower plate, and a quartz inner cylinder are dismounted)
Figure 5B:
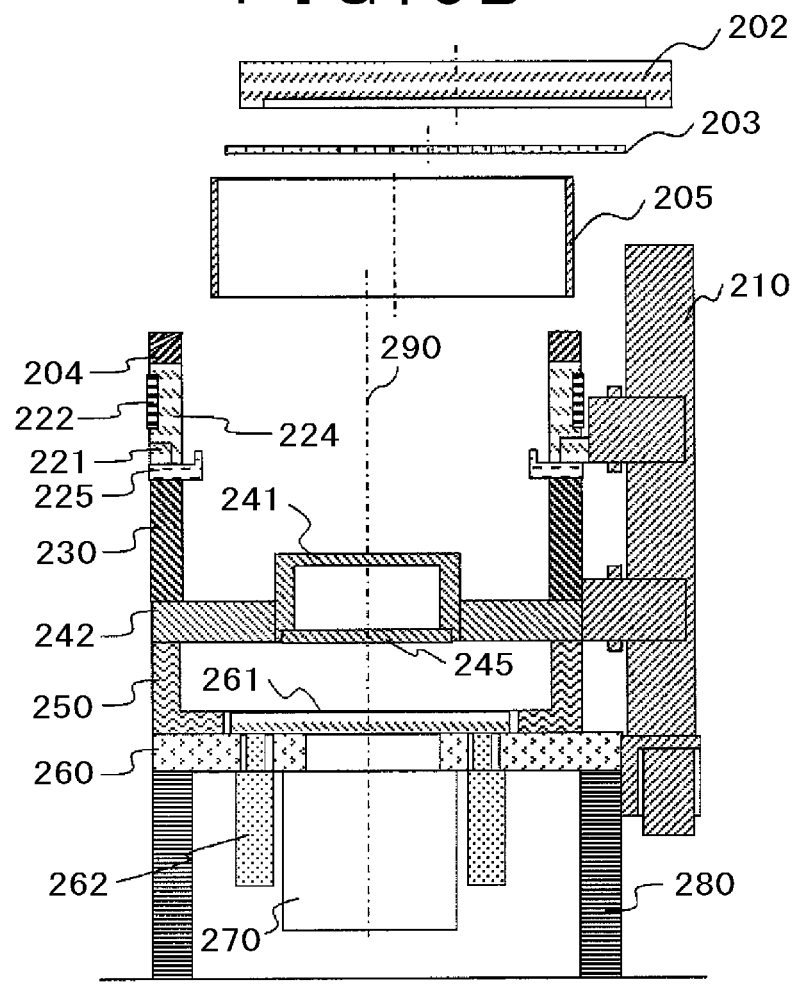
FIG. 5B is a schematic cross sectional view of the vacuum processing chamber illustrated in FIG. 5A.

Subsequently, as illustrated in FIGS. 5A and 5B, the quartz plate 202, and the shower plate 203 and the quartz inner cylinder 205 on the lower part of the quartz plate 202 are moved upwardly and dismounted. Thus, the gas introducing ring 204 is exposed on the top end of the vacuum processing chamber. Moreover, the sample stage 241 and the support beam portion of the sample stage base 242 are exposed in the vacuum processing chamber.

Figure 6A:
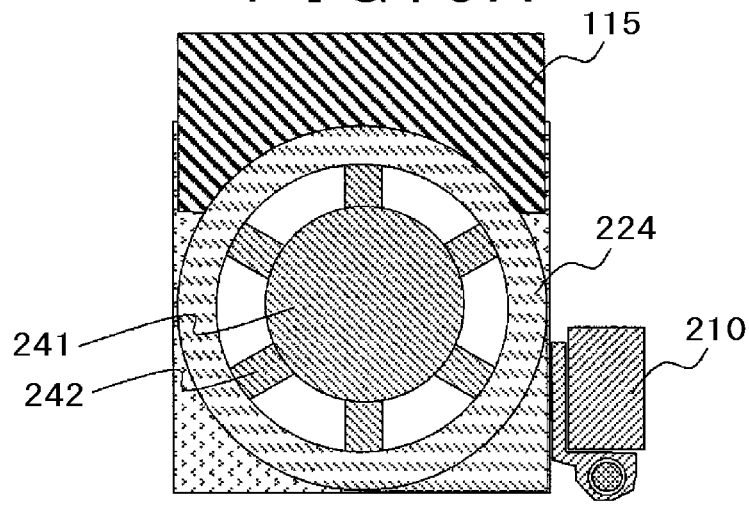
FIG. 6A is a top view for explaining the procedures of maintenance in the vacuum processing chamber of the vacuum processing apparatus according to the embodiment of the present invention (a gas introducing ring is dismounted)
Figure 6B:
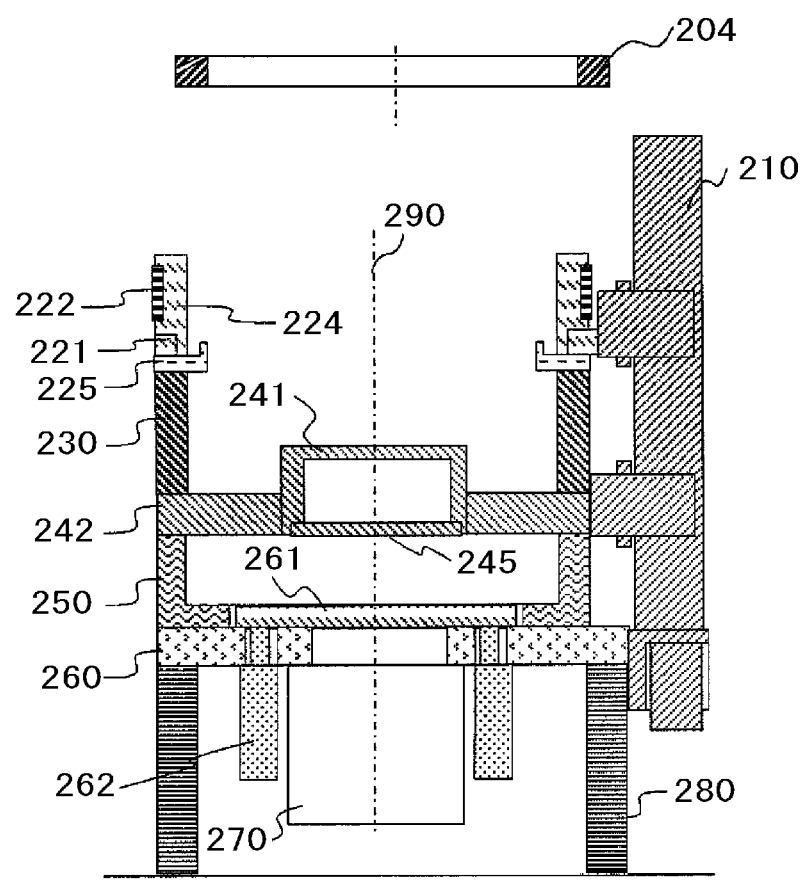
FIG. 6B is a schematic cross sectional view of the vacuum processing chamber illustrated in FIG. 6A.

Subsequently, as illustrated in FIGS. 6A and 6B, the gas introducing ring 204 is moved upwardly and dismounted.

Figure 7A:
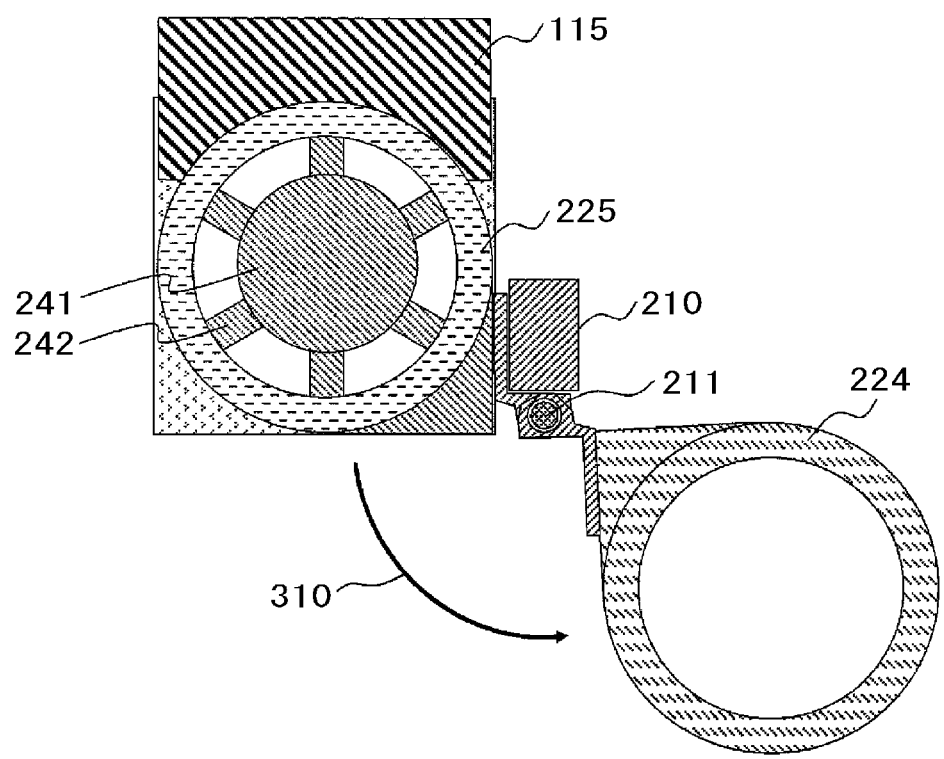
FIG. 7A is a top view for explaining the procedures of maintenance in the vacuum processing chamber of the vacuum processing apparatus according to the embodiment of the present invention (a discharge block unit is lifted and rotated by a rotating lifter)
Figure 7B:
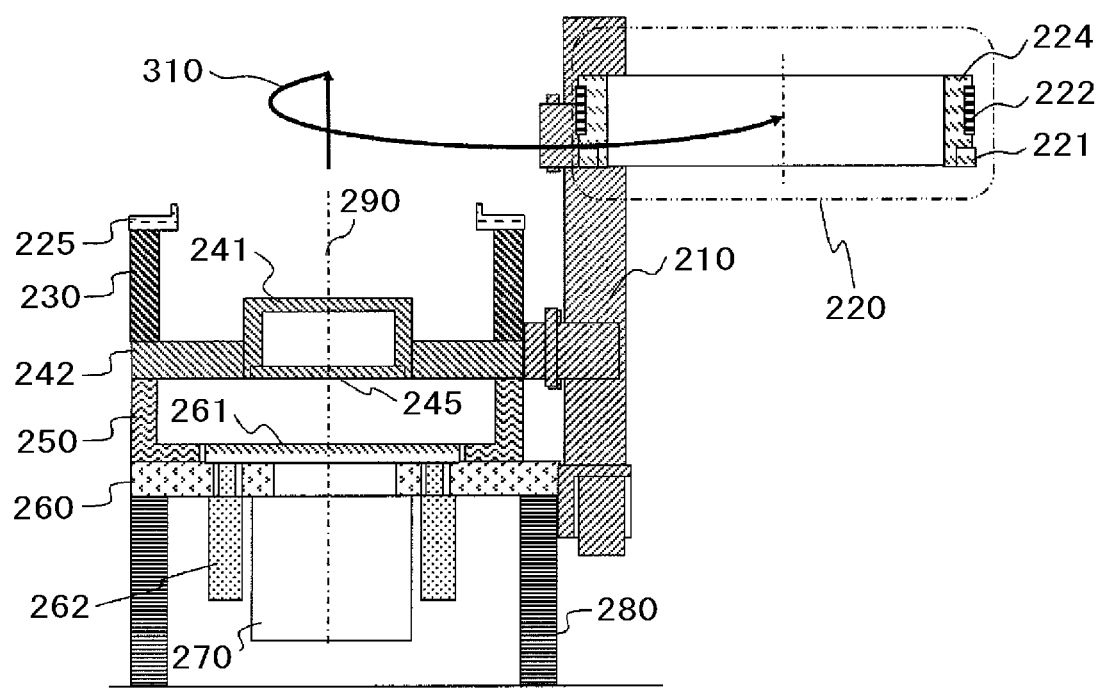
FIG. 7B is a schematic cross sectional view of the vacuum processing chamber illustrated in FIG. 7A.

Subsequently, as illustrated in FIGS. 7A and 7B, the discharge block unit 220 including the discharge block base 221 fixed to the movable unit of the rotating lifter 210 and the discharge block 224 and the heater 222 mounted on the discharge block base 221 is moved upwardly about a pivot axis 211 as illustrated in an arrow 310, rotated in the counterclockwise direction, and moved to the outside of the region of the vacuum processing chamber when seen perpendicularly from above. In the embodiment, the discharge block unit is rotated in the counterclockwise direction. However, such a configuration may be possible in which the position of the rotating lifter is changed to the opposite side (in the drawing, the position is changed from the right side to the left side) and the rotating lifter is rotated in the clockwise direction. The distance along which the discharge block unit 220 is moved upwardly is the height beyond the projection of the earth ring 225. In the embodiment, the distance was 5 cm, but the distance is not limited thereto. It is noted that in the case where the height of the projection of the earth ring is low, the distance is the height of the O-ring 207 apart from the discharge block unit 220 or the earth ring 225 (a few centimeters) or more. Moreover, the rotation angle was an angle of 180 degrees. However, the rotation angle may be an angle of 90 degrees or greater and an angle of 270 degrees or less. However, in consideration of workability, an angle of 180 degrees±20 degrees is preferable. The members related to discharge, which are not targets for regular maintenance, are collectively rotated together with the discharge block unit 220, so that it is possible to quickly and easily retract the members from the upper part of the vacuum processing chamber. The discharge block unit 220 is retracted, and the earth ring 225 is exposed on the top end of the vacuum processing chamber.

Figure 8A:
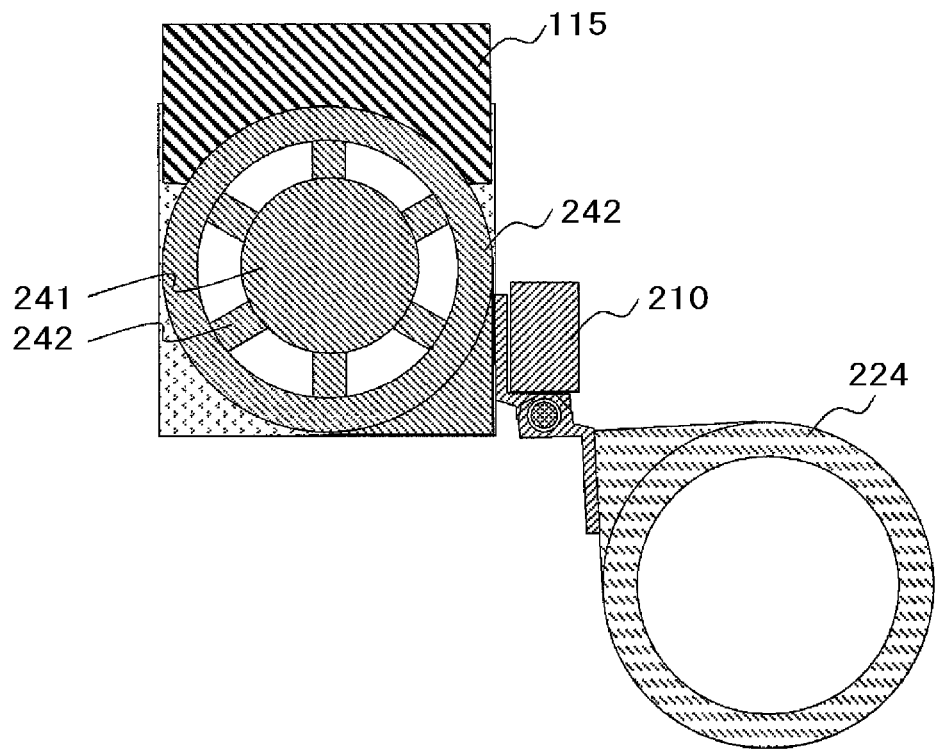
FIG. 8A is a top view for explaining the procedures of maintenance in the vacuum processing chamber of the vacuum processing apparatus according to the embodiment of the present invention (an earth ring and an upper container are dismounted)
Figure 8B:
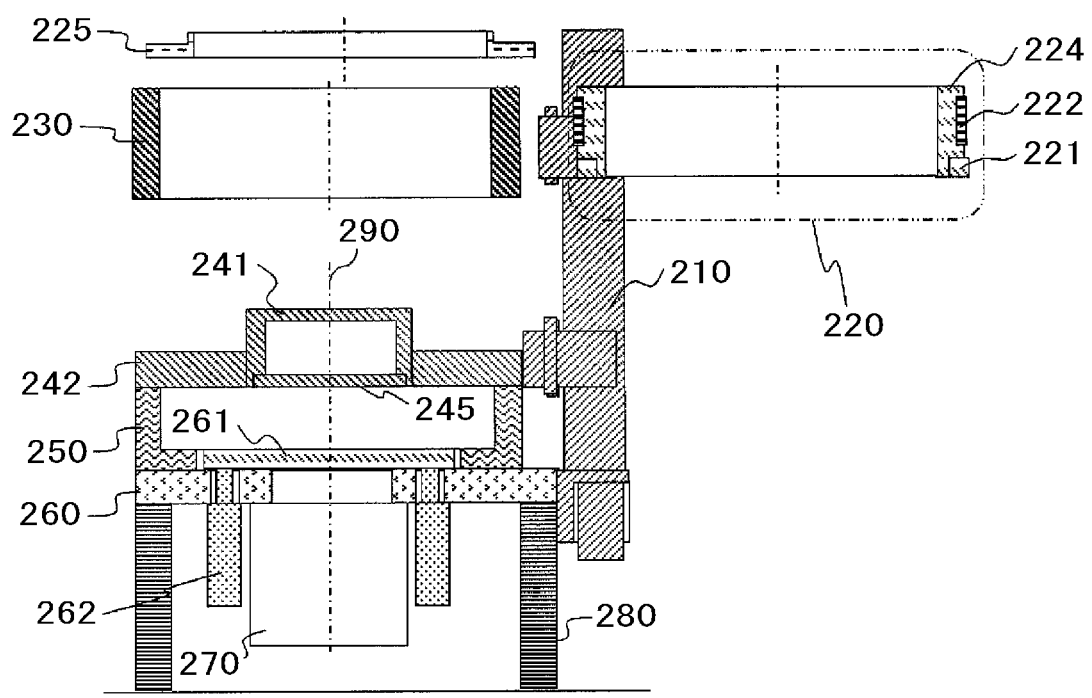
FIG. 8B is a schematic cross sectional view of the vacuum processing chamber illustrated in FIG. 8A.

Subsequently, as illustrated in FIGS. 8A and 8B, the earth ring 225 and the upper container 230 that is the main member for regular maintenance are moved upwardly and dismounted. In other words, the upper container 230 can be easily dismounted in the swappable (replaceable) state. In the embodiment, the vacuum wall itself (the upper container) configuring the vacuum processing chamber is replaceable. Thus, the maintenance time of the upper container 230 after the vacuum processing chamber is disassembled can be suppressed at the minimum. It is noted that in performing maintenance, the first gate valve is closed, and the second gate valve is opened. The first gate valve 111 is closed to vacuum-seal the vacuum transport chamber 104, so that processing is enabled in the other vacuum processing chambers, and the reduction in the operation rate as the vacuum processing apparatus can be suppressed at the minimum. On the other hand, the second gate valve 112 is opened, so that the upper container 230 can be separated from the valve box 115. The upper container 230 was dismounted after the screws were removed which fixed the upper container 230 to the base plate 260 with the flanges. The discharge block unit was moved by a controller controlling the rotating lifter. This controller may be dedicated to the rotating lifter, or may be built in as a part of the controller for the overall vacuum processing apparatus. The upper container 230 is dismounted, and the ring portion of the sample stage base 242 is exposed in addition to the sample stage 241 and the support beam.

Figure 9A:
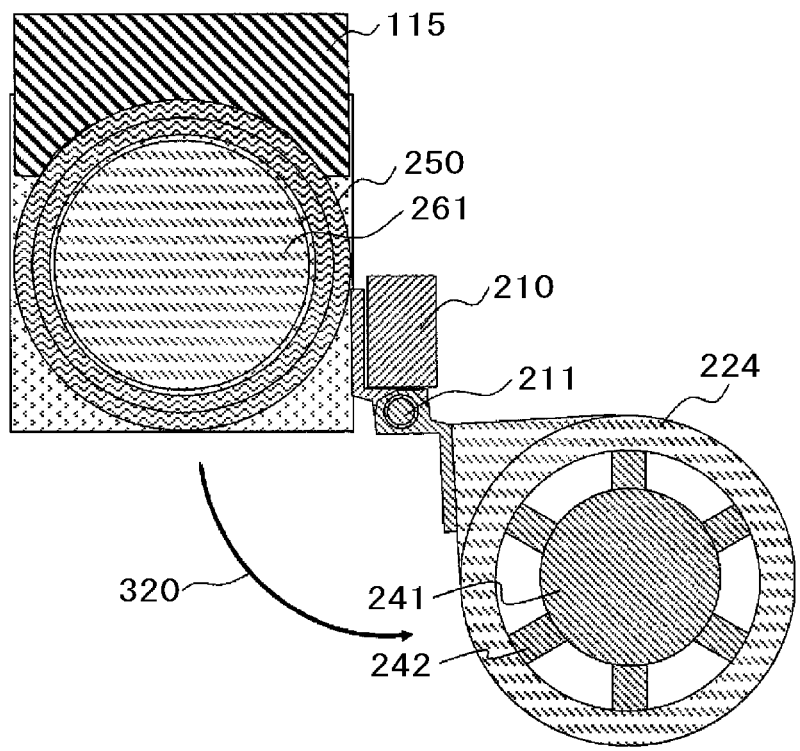
FIG. 9A is a top view for explaining the procedures of maintenance in the vacuum processing chamber of the vacuum processing apparatus according to the embodiment of the present invention (a sample stage unit is lifted and rotated by the rotating lifter).
Figure 9B:
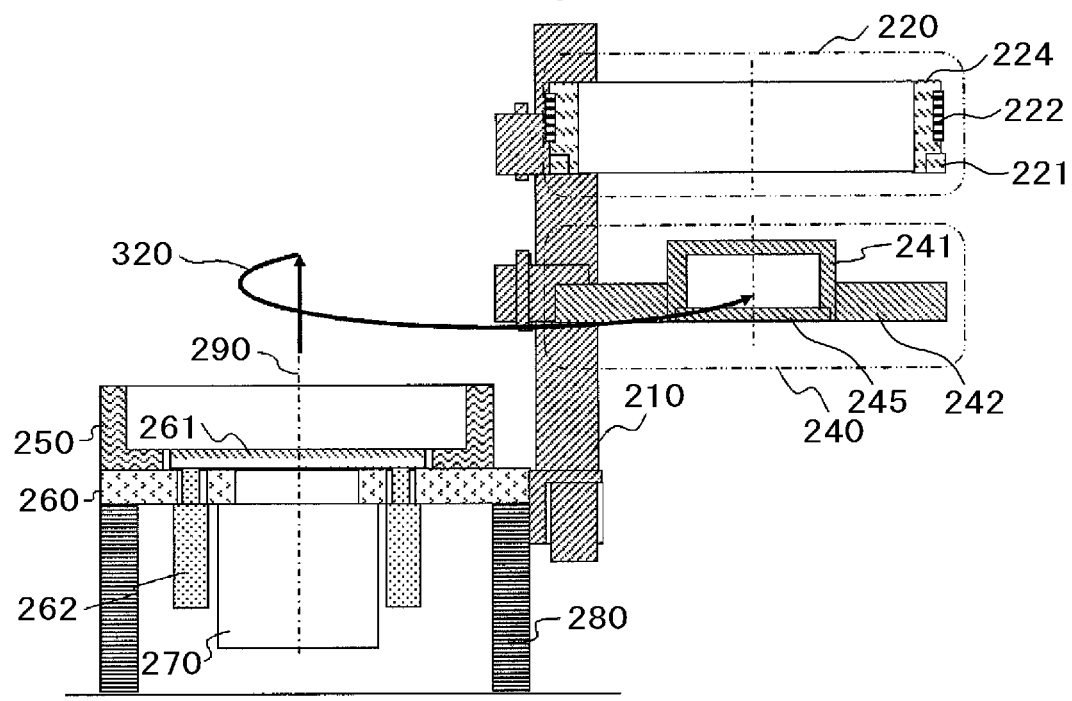
FIG. 9B is a schematic cross sectional view of the vacuum processing chamber illustrated in FIG. 9A.

Subsequently, as illustrated in FIGS. 9A and 9B, the sample stage unit 240 including the sample stage base 242 fixed to the movable unit of the rotating lifter 210 and the sample stage 241 and the sample stage bottom cover 245 mounted on the sample stage base 242 is moved upwardly about the pivot axis 211 as illustrated in an arrow 320, horizontally rotated in the counterclockwise direction, and moved to the outside of the region of the vacuum processing chamber when seen perpendicularly from above. In the embodiment, the sample stage unit is rotated in the counterclockwise direction. However, such a configuration may be possible in which the position of the rotating lifter is changed to the opposite side (in the drawing, the position is changed from the right side to the left side) and the rotating lifter is rotated in the clockwise direction. The distance along which the sample stage unit 240 is moved upwardly is the height of the O-ring 207 apart from the sample stage unit 240 or the lower container 250 or more. In the embodiment, the distance was 2 cm, but is not limited thereto. Moreover, desirably, the rotation angle is set so as to be the same as the discharge block unit 220. Thus, the total area of the discharge block unit 220 and the sample stage unit 240 can be reduced when seen perpendicularly from above. The members related to the sample stage, which are not targets for regular maintenance, are collectively rotated as the sample stage unit 240, so that it is possible to quickly and easily retract the members from the upper part of the vacuum processing chamber. The sample stage unit 240 was moved by the controller controlling the rotating lifter. This controller may be dedicated to the rotating lifter, or may be built in as a part of the controller for the overall vacuum processing apparatus. The sample stage unit 240 is retracted, and the lower container 250 is exposed on the top end of the vacuum processing chamber. Furthermore, the entire surface of the exhaust unit cover 261 is exposed.

Figure 10A:
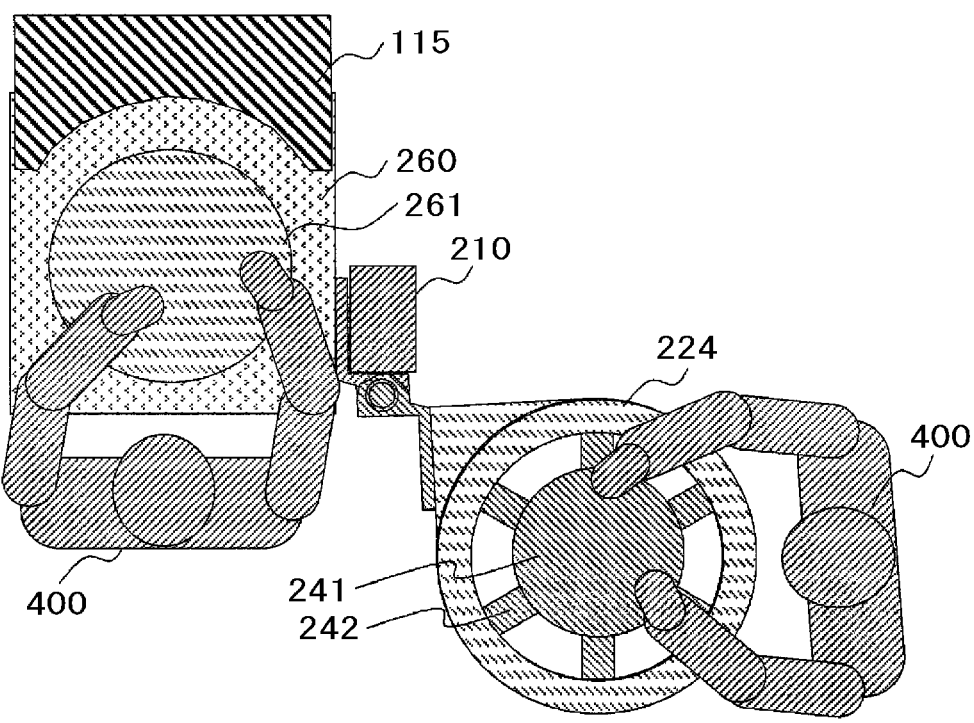
FIG. 10A is a top view for explaining the procedures of maintenance in the vacuum processing chamber of the vacuum processing apparatus according to the embodiment of the present invention (a lower container is dismounted)
Figure 10B:
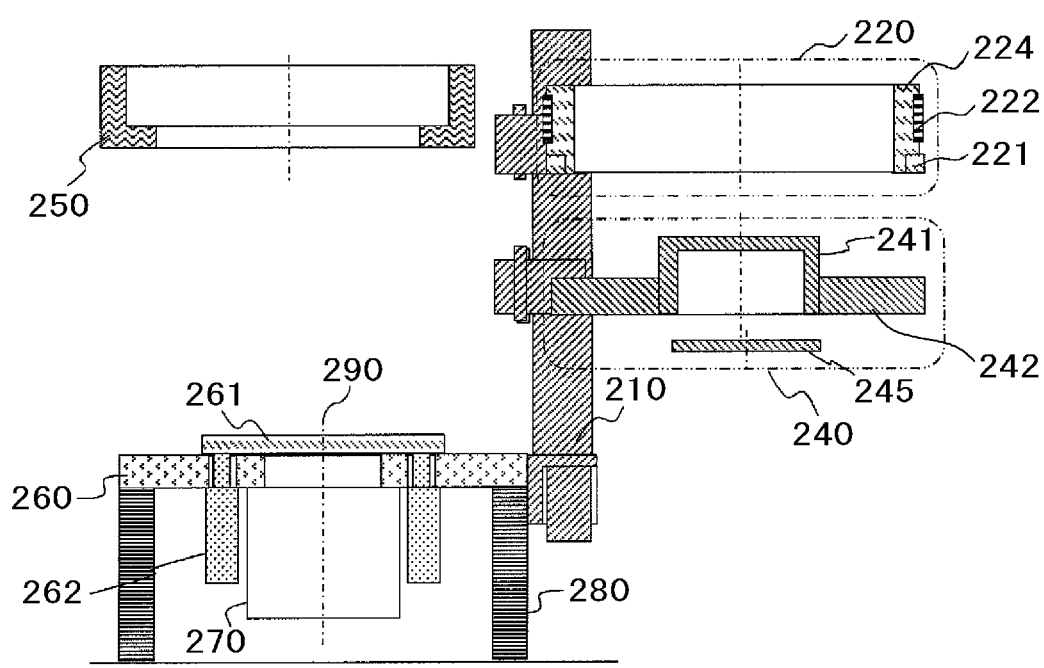
FIG. 10B is a schematic cross sectional view of the vacuum processing chamber illustrated in FIG. 10A.

Subsequently, after removing the screws fixing the lower container 250 to the base plate 260 with the flanges, the lower container 250 that is the main member for regular maintenance is moved upwardly and dismounted as illustrated in FIGS. 10A and 10B. In other words, the lower container 250 can be easily dismounted in the swappable (replaceable) state. Thus, the maintenance time of the lower container 250 after the vacuum processing chamber is disassembled can be suppressed at the minimum. After the lower container 250 is dismounted, the inspection and maintenance are performed for the surface of the base plate 260 and the surface of the exhaust unit cover 261. A small amount of reaction products is attached to the exposed portion of the base plate 260 because the base plate 260 is coved with the lower container 250, and a small amount of reaction products is attached to the upper surface of the exhaust unit cover 261 because the exhaust unit cover 261 is disposed below the sample stage in processing a workpiece. However, both can be cleaned as necessary. The walls or the like (obstacles to maintenance) configuring the vacuum processing chamber are not provided around the base plate 260 and the region around the base plate 260 is flat, so that it is possible to improve the working efficiency of maintenance conducted by an operator 400 (not illustrated in FIG. 10B).

After the cleaning, inspection, maintenance, and replacement of the members (more specifically, the upper container and the lower container) targeted for regular maintenance, the members are assembled in the procedures reverse to the description above, and serve for vacuum processing.

Next, the procedures of occasional maintenance will be described. The members targeted for occasional maintenance are mainly the members configuring the discharge block unit 220 and the members configuring the sample stage unit 240. In the case of the members configuring the discharge block unit 220, as illustrated in FIGS. 7A and 7B, the discharge block unit 220 is lifted upwardly, and horizontally rotated, and then maintenance can be performed from a desired direction such as the inspection and replacement of the heater 222 and the inspection and cleaning of the inner wall of the discharge block 224. The discharge block unit 220 is retracted from the other members configuring the vacuum processing chamber, so that working efficiency can be improved.

In the case of the members configuring the sample stage unit 240, as illustrated in FIGS. 9A and 9B, the sample stage unit is lifted upwardly, and horizontally rotated, and as illustrated in FIG. 10B, the sample stage bottom cover is then dismounted, and maintenance can be performed from a desired direction for temperature adjustment parts and the wiring of various power supply codes and sensors. The hollow space in the support beam includes at least one of a wiring code used for electrostatically chucking the workpiece to the sample stage, a wiring code used for applying a radio frequency bias to the sample stage, and a wiring code or a coolant pipe used for controlling the temperature of the sample stage, and a wiring code used for detecting the temperature of the sample stage, which are also the targets for occasional maintenance. It is noted that in the case where the discharge block unit 220 becomes an obstacle to the operation, the discharge block unit 220 can be rotated in the clockwise direction to the region in which the vacuum processing chamber is disposed or to near the region when seen perpendicularly from above. Thus, the working efficiency of the sample stage unit 240 can be improved. Moreover, the rotation angles of the discharge block unit and the sample stage unit are appropriately displaced to simultaneously perform the maintenance of the discharge block unit and the sample stage unit, so that working efficiency is improved.

It is noted that in the embodiment, the discharge block unit and the sample stage unit are lifted upwardly, and then horizontally rotated. However, such a configuration may be possible in which the discharge block unit and the sample stage unit are lifted, and then linearly and horizontally extracted. Thus, the moving range can be made at the minimum. Moreover, the configurations of the moving mechanisms can be simplified. However, horizontal rotation is advantageous for securing the work space for maintenance.

Furthermore, in the embodiment, the upper container as well as the lower container are replaced. However, such a configuration may be possible in which a liner (a cover) is mounted so as to cover the inner surface of the lower container and the liner is replaced.

In addition, in the embodiment, a single rotating lifter is provided, and the discharge block unit and the sample stage unit are rotated in the same direction. However, it may be possible that in the case where the work area can be secured, two rotating lifters are provided, and the rotating lifters are rotated in different directions. A rotating lifter for the discharge block unit and a rotating lifter for the sample stage unit are separately provided, so that the heights of the units can be freely set. Moreover, a larger number of operators can be assigned, so that the operations can be performed at the same time, the operations can be finished for a short time, and working efficiency is improved.

Furthermore, in the embodiment, the components other than the discharge block unit and the sample stage unit, which are moved using the rotating lifter, are moved manually. However, the components may be moved using a crane or the like.

In addition, in the embodiment, an ECR type vacuum processing apparatus is used as the vacuum processing apparatus. However, the vacuum processing apparatus is also applicable to an ICP type apparatus. Moreover, the vacuum processing apparatus including the vacuum processing chambers arranged in the link system is used. However, the vacuum processing apparatus is also applicable to a cluster system apparatus, not limited thereto.

As described above, according to the embodiment, it is possible to provide a vacuum processing apparatus that can excellently perform uniform processing (discharging in coaxial symmetry) and can efficiently perform regular maintenance as well as occasional maintenance even in the case where the diameter of a workpiece is increased.

It is noted that the present invention is not limited to the foregoing embodiment, and includes various exemplary modifications. For example, the foregoing embodiment is described in detail for easily understanding the present invention, and is not always limited to ones including all the configurations described. Moreover, a part of a certain configuration can be replaced with another configuration, and a certain configuration can be added with another configuration.

What is claimed is:

1. A vacuum processing apparatus comprising:
at least one vacuum transport chamber; and
at least one vacuum processing chamber coupled to the at least one vacuum transport chamber via a valve box disposed between the at least one vacuum transport chamber and the at least one vacuum processing chamber,
wherein the at least one vacuum processing chamber, the at least one vacuum transfer chamber, and the valve box are respectively arranged in an atmosphere, and the at least one vacuum processing chamber and the at least one vacuum transfer chamber are disposed outside the valve box, and the valve box includes a transferring path for a workpiece to be processed through which the workpiece is transferred between said at least one vacuum transport chamber and the at least one processing chamber along a predetermined horizontal direction, and the at least one vacuum transport chamber and the valve box and the at least one processing chamber are arranged in this order in the predetermined horizontal direction,
wherein the at least one vacuum processing chamber includes
a base plate having an exhaust opening;
a lower container disposed on the base plate, the lower container having an inner wall in a circular shape in a horizontal cross section;
a sample stage unit including a sample stage on which the workpiece is located, and a ring-shaped sample stage base which is disposed around the sample stage on the lower container and is connected to the sample stage through a plurality of support beams supporting the sample stage, wherein the plurality of support beams are disposed in axial symmetry with respect to a center axis of the sample stage, and wherein the exhaust opening of the base plate is disposed directly below the sample stage;
an upper container disposed on the ring-shaped sample stage base of the sample stage unit, the upper container having an inner side wall in a circular shape in a horizontal cross section and an outer side wall to which one end portion of the valve box is connected in an air-tight manner;

vacuum seals air-tightly sealing an inside space of the at least one vacuum processing chamber from the atmosphere in the atmospheric pressure surrounding the at least one vacuum processing chamber and the valve box when the upper container is fixed to the base plate while (i) the outer side wall of the upper container is connected to one end of the valve box in the air-tight manner and (ii) the lower container and the ring-shaped sample stage base are sandwiched between the upper container and the base plate, wherein portions of outer walls of the upper container and the valve box are exposed in the atmosphere and the vacuum seals are disposed between the base plate, the lower container, the ring-shaped sample stage base, and the upper container; and a rotating lifter which extends along a vertical direction and is disposed on an outside of the ring-shaped sample stage base, the rotating lifter being arranged in an outer peripheral region of the base plate and being located at a position horizontally farther than a center of the sample stage with respect to the valve box when the upper container is located above the ring-shaped sample stage base and is connected to one end of the valve box, and the rotating lifter is coupled to the ring-shaped sample stage base and a discharge block unit respectively in an upper portion of the lower end portion thereof, wherein the rotating lifter has a pivot disposed above the lower end portion thereof, the ring-shaped sample stage base being coupled to the rotating lifter via the pivot, and the pivot extending in parallel to the vertical direction and being located at a position horizontally farther than a center of the sample stage with respect to the valve box, and wherein the rotating lifter is configured to perform a vertical operation to move the sample stage unit in a vertical direction parallel to the vertical direction in the rotating lifter with respect to the lower container, and to perform a horizontal operation to move the sample stage unit in a horizontal direction around the pivot to a position distanced away from a region directly above the lower container with respect to the valve box.

2. The vacuum processing apparatus according to claim 1, wherein the vacuum transport chamber includes a first opening through which the workpiece is loaded into and unloaded out of the at least one vacuum processing chamber and a first gate valve configured to open and close the first opening;

the upper container includes a second opening through which the workpiece is loaded into and unloaded out of the at least one vacuum transport chamber; and the valve box connects the first opening to the second opening and includes a second gate valve which is configured to open and close the second opening.

3. The vacuum processing apparatus according to claim 2, wherein in performing maintenance of the vacuum processing apparatus, the first gate valve is closed and the second gate valve is opened.

4. The vacuum processing apparatus according to claim 1, wherein the upper container and the lower container are replaceable when performing maintenance on the vacuum processing apparatus.

5. The vacuum processing apparatus according to claim 1, wherein
the lower container includes a liner inside the lower container; and
the liner of the lower container and the upper container are replaceable when performing maintenance on the vacuum processing apparatus.

6. The vacuum processing apparatus according to claim 1, wherein a hollow space provided in the support beam includes at least one of a wiring code used for electrostatically chucking the workpiece to the sample stage, a wiring code used for applying a radio frequency bias to the sample stage, a wiring code or a coolant pipe used for controlling a temperature of the sample stage, and a wiring code use for detecting a temperature of the sample stage.

7. The vacuum processing apparatus according to claim 1, wherein a dry etching process is performed in the at least one vacuum processing chamber.

8. The vacuum processing apparatus according to claim 1, wherein two of said vacuum processing chambers are disposed adjacent to each other sandwiching a work space therebetween inside which an user can enter and exit for doing a maintenance operation, and the rotating lifter is configured to perform the horizontal operation to move the sample stage unit to be horizontally between the region directly above the lower vessel and the work space.

* * * * *